United States Patent
Kubota et al.

(10) Patent No.: US 11,717,931 B2
(45) Date of Patent: Aug. 8, 2023

(54) APPARATUS AND METHOD FOR DOUBLE-SIDE POLISHING WORK

(71) Applicant: SUMCO CORPORATION, Tokyo (JP)

(72) Inventors: Mami Kubota, Tokyo (JP); Keiichi Takanashi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 400 days.

(21) Appl. No.: 16/958,279

(22) PCT Filed: Oct. 22, 2018

(86) PCT No.: PCT/JP2018/039167
§ 371 (c)(1),
(2) Date: Jun. 26, 2020

(87) PCT Pub. No.: WO2019/130757
PCT Pub. Date: Jul. 4, 2019

(65) Prior Publication Data
US 2020/0346319 A1 Nov. 5, 2020

(30) Foreign Application Priority Data
Dec. 28, 2017 (JP) .................. 2017-253906

(51) Int. Cl.
*B24B 37/08* (2012.01)
*B24B 37/04* (2012.01)

(52) U.S. Cl.
CPC ............ *B24B 37/08* (2013.01); *B24B 37/042* (2013.01)

(58) Field of Classification Search
None
See application file for complete search history.

(56) References Cited

U.S. PATENT DOCUMENTS

| | | |
|---|---|---|
| 2002/0053358 A1 | 5/2002 | Denda et al. |
| 2015/0065010 A1 | 3/2015 | Miura et al. |
| 2017/0355060 A1 | 12/2017 | Park |

FOREIGN PATENT DOCUMENTS

| | | |
|---|---|---|
| CN | 107210211 A | 9/2017 |
| JP | 2002-170800 A | 6/2002 |

(Continued)

OTHER PUBLICATIONS

Office Action for JP App. No. 2017-253906, dated Sep. 1, 2020 (w/translation).

(Continued)

*Primary Examiner* — Long Pham
(74) *Attorney, Agent, or Firm* — Greenblum & Bernstein, P.L.C.

(57) ABSTRACT

Provided is a double-side polishing apparatus and a double-side polishing method which make it possible to terminate double-side polishing with timing allowing a work having been polished to have a target shape. A computing unit 13 performs a step of grouping the data of thicknesses measured using work thickness measuring devices 11 on a work basis; a step of extracting shape components of each work from the thickness data; a step of identifying a position of each of the shape components in the work radial direction; a step of computing a shape distribution of the work from the identified position ; a step of obtaining a shape index of the work from the computed shape distribution; and a step of determining timing of termination of the double-side polishing based on the obtained shape index, thus timing of termination of the double-side polishing is determined.

12 Claims, 7 Drawing Sheets

(56) References Cited

FOREIGN PATENT DOCUMENTS

| JP | 2010-30019 A | 2/2010 |
| JP | 2012-19114 A | 1/2012 |
| JP | 2015-47656 A | 3/2015 |
| JP | 2017-204609 A | 11/2017 |
| JP | 2017-207455 A | 11/2017 |
| TW | 201515768 A | 5/2015 |
| WO | WO 2010/037452 A1 | 4/2010 |

OTHER PUBLICATIONS

Third Party Observation for DE App. No. 11 2018 006 664.9, dated Feb. 3, 2022 (w/translation).
ISR for PCT/JP2018/039167, dated Dec. 25, 2018.
Office Action for TW App. No. 10820894670, dated Sep. 20, 2019 (w/ translation).
IPRP for PCT/JP2018/039167, dated Jun. 30, 2020 (w/ translation).

Polishing time

Polishing time

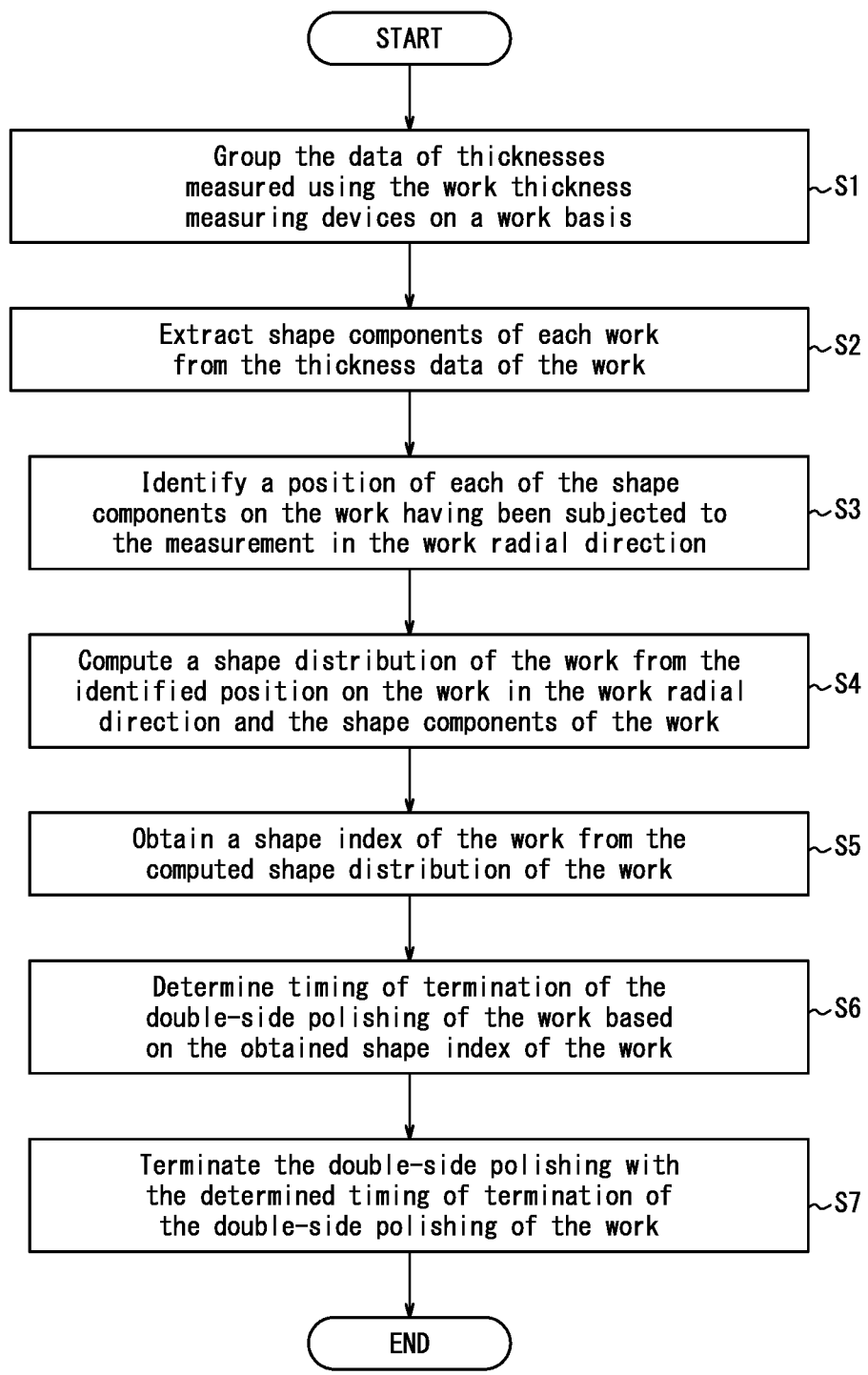

APPARATUS AND METHOD FOR DOUBLE-SIDE POLISHING WORK

TECHNICAL FIELD

This disclosure relates to a double-side polishing apparatus and a double-side polishing method for a work.

BACKGROUND

In the production of a semiconductor wafer such as a silicon wafer, which is a typical example of a work to be polished, in order to obtain a wafer having flatness quality or surface smoothness quality controlled with higher precision, a double-side polishing process is typically used, by which front and back surfaces of the wafer are polished simultaneously.

Especially in recent years, since semiconductor devices have been miniaturized and the diameter of semiconductor wafers has been increased, there is a more severe demand for flatness of semiconductor wafers during light exposure. Given this background, there is a strong need for a technique to terminate double-side polishing in a timely manner.

In typical double-side polishing, in an initial stage of polishing, the whole surface of the wafer has an upward convex shape, and the wafer greatly sags at the periphery. Here, the thickness of the wafer is sufficiently larger than the thickness of a carrier plate. Next, as the polishing proceeds, the whole surface of the wafer becomes flatter; however, the periphery of the wafer remains sagging. Here, the thickness of the wafer is slightly larger than the thickness of the carrier plate. As the polishing proceeds further, the wafer becomes almost flat and the periphery of the wafer comes to be less sagging. Here, the thickness of the wafer is almost the same as the thickness of the carrier plate. After that, as the polishing proceeds, the shape of the wafer is gradually depressed at the center, and the periphery of the wafer comes to have a raised shape. At this point, the thickness of the carrier plate is larger than the thickness of the wafer.

In view of the above, in order to obtain a wafer having high flatness over the whole surface and the periphery, wafers have been typically polished such that the wafers have almost the same thickness as the carrier plate, and an operator has adjusted the polishing time to control the thickness.

However, adjustment of the polishing time performed by an operator has been significantly influenced by polishing conditions such as the replacement period for the secondary materials for polishing and difference in timing of the deactivation of an apparatus. Accordingly, the polishing degree cannot always have been controlled accurately, so it has largely relied on the experience of the operator.

On the other hand, for example, JP 2010-030019 A (PTL 1) proposes a double-side polishing apparatus for wafers, by which the thickness of a wafer being polished is measured in real time through monitoring holes above an upper plate (or below a lower plate), and the timing of termination of the polishing can be evaluated based on the result of the measurement.

CITATION LIST

Patent Literature

PTL 1: JP 2010-030019 A

SUMMARY

Technical Problem

In conventional methods including the method of PTL 1, the timing of termination of double-side polishing is determined based on the result of measurement of wafer thickness, thus polishing can be terminated when a predetermined thickness is obtained. However, the methods have a problem in that the shape of a wafer having been polished does not agree with the target shape.

With a view to solving the above problem, it could be helpful to provide a double-side polishing apparatus and a double-side polishing method for a work which make it possible to terminate double-side polishing during the double-side polishing with timing allowing the work having been polished to have a target shape.

Solution to Problem

We propose the following features to solve the above problem.

(1) A double-side polishing apparatus for a work, including rotating plates having an upper plate and a lower plate, a sun gear provided at a center portion of the rotating plates, an internal gear provided at a peripheral portion of the rotating plates, and a carrier plate, which carrier plate is provided between the upper plate and the lower plate provided with one or more openings for holding the work, wherein one of the upper plate and the lower plate has one or more holes penetrating from the top surface to the bottom surface of the one of the upper plate and the lower plate, the double-side polishing apparatus for a work comprises one or more work thickness measuring devices which can measure the thickness of each work through the one or more holes in real time during double-side polishing of the work, and the double-side polishing apparatus comprises a computing unit for determining, during the double-side polishing of the work, timing of termination of the double-side polishing of the work, which computing unit performs:

a first step of grouping the data of thicknesses of the works, measured using the work thickness measuring devices on a work basis;

a second step of extracting shape components of each work from the thickness data of the work;

a third step of identifying a position of each of the shape components on the work having been subjected to the measurement in the work radial direction;

a fourth step of computing a shape distribution of the work from the identified position on the work in the work radial direction and the shape components of the work;

a fifth step of obtaining a shape index of the work from the computed shape distribution of the work; and a sixth step of determining timing of termination of the double-side polishing of the work based on the obtained shape index of the work, whereby terminating the double-side polishing with the determined timing of termination of the double-side polishing of the work.

(2) The double-side polishing apparatus for a work, according to (1) above, wherein in the third step, the position of each shape component of the work subjected to the measurement in the wafer radial direction is identified by actually measuring a distance between a center of the sun gear and a center of the hole, a rotation angle of the carrier plate, and a revolution angle α of the carrier plate; or the position of each shape component of the work subjected to the measurement in the wafer radial direction is identified by calculating measurable intervals in which the thickness of the work can be measured by simulation under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable intervals and actually measurable intervals best match.

(3) The double-side polishing apparatus for a work, according to (1) or (2) above, wherein in the sixth step, a relationship between the shape indices of the works and polishing time is linearly approximated, and a polishing time after which the shape indices of the works become a predetermined value is determined as timing of termination of the double-side polishing of the works, from the straight line found by the approximation.

(4) The double-side polishing apparatus for a work, according to any one of (1) to (3) above, wherein in the fifth step, a relationship between the shape components of the work and the position of each shape component of the work in the work radial direction is approximated by an even function, and a shape index of the work is determined based on a maximum value and a minimum value of the even function obtained by the approximation.

(5) The double-side polishing apparatus for a work, according to any one of (1) to (4) above, wherein in the first step, thickness data of the works are grouped on a work basis based on time intervals in which the thickness data of the works are consecutively obtained.

(6) The double-side polishing apparatus for a work, according to any one of (1) to (5) above, wherein in the second step, a relationship between thickness data of the work and polishing time is approximated by a quadratic function, and a difference between the thickness data of the work and the quadratic function obtained by the approximation is used as a shape component.

(7) A double-side polishing method for a work, wherein a work is held in a carrier plate provided with one or more openings for holding the work; the work is sandwiched between rotating plates composed of an upper plate and a lower plate; rotation and revolution of the carrier plate are controlled by rotation of a sun gear provided at a center portion of the rotating plates and rotation of an internal gear provided at a peripheral portion of the rotating plates; and thus the rotating plates and the carrier plate are relatively rotated to simultaneously polish both surfaces of the work, one of the upper plate and the lower plate has one or more holes penetrating from the top surface to the bottom surface of the one of the upper plate and the lower plate, and the double-side polishing method for a work comprises, during double-side polishing of the work:
 a first step of grouping the data of thicknesses measured using the work thickness measuring devices on a work basis;
 a second step of extracting shape components of each work from the thickness data of the work;
 a third step of identifying a position of each of the shape components on the work having been subjected to the measurement in the work radial direction;
 a fourth step of computing a shape distribution of the work from the identified position on the work in the work radial direction and the shape components of the work;
 a fifth step of obtaining a shape index of the work from the computed shape distribution of the work; and
 a sixth step of determining timing of termination of the double-side polishing of the work based on the obtained shape index of the work, whereby terminating the double-side polishing with the determined timing of termination of the double-side polishing of the work.

(8) The double-side polishing method for a work, according to (7) above, wherein in the third step, the position of each shape component of the work subjected to the measurement in the wafer radial direction is identified by actually measuring a distance between a center of the sun gear and a center of the hole, a rotation angle of the carrier plate, and a revolution angle α of the carrier plate; or the position of each shape component of the work subjected to the measurement in the wafer radial direction is identified by calculating measurable intervals in which the thickness of the work can be measured by simulation under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable intervals and actually measurable intervals best match.

(9) The double-side polishing method for a work, according to (7) or (8) above, wherein in the sixth step, a relationship between the shape indices of the works and polishing time is linearly approximated, and a polishing time after which the shape indices of the works become a predetermined value is determined as timing of termination of the double-side polishing of the works, from the straight line found by the approximation.

(10) The double-side polishing method for a work, according to any one of (7) to (9) above, wherein in the fifth step, a relationship between the shape components of the work and the position of each shape component of the work in the work radial direction is approximated by an even function, and a shape index of the work is determined based on a maximum value and a minimum value of the even function obtained by the approximation.

(11) The double-side polishing method for a work, according to any one of (7) to (10) above, wherein in the first step, thickness data of the works are grouped on a work basis based on time intervals in which the thickness data of the works are consecutively obtained.

(12) The double-side polishing method for a work, according to any one of (7) to (11) above, wherein in the second step, a relationship between thickness data of the work and polishing time is approximated by a quadratic function, and a difference between the thickness data of the work and the quadratic function obtained by the approximation is used as a shape component.

Advantageous Effect

According to this disclosure, the timing of termination of double-side polishing is determined based on the shape index of a work, thus the double-side polishing can be terminated during the double-side polishing with timing allowing the work having been polished to have a target shape.

BRIEF DESCRIPTION OF THE DRAWINGS

In the accompanying drawings:

FIG. 11 is a flowchart of a double-side polishing method for a work, according to this disclosure.

DETAILED DESCRIPTION (Double-Side Polishing Apparatus for Work)

Figure 1:
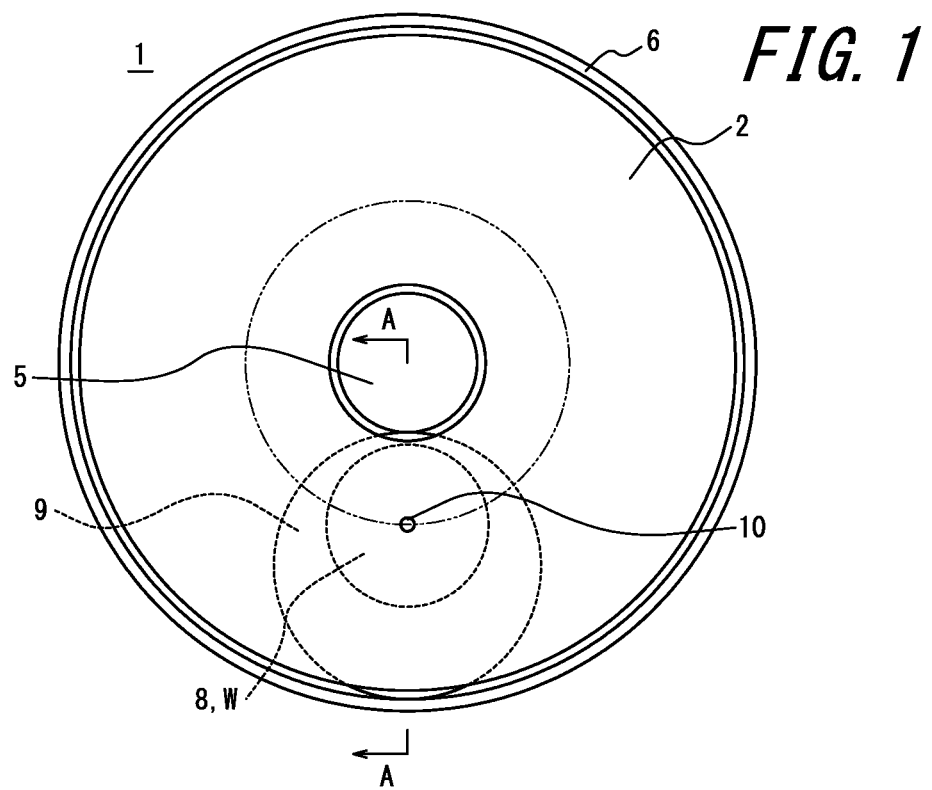
FIG. 1 is a top view of a double-side polishing apparatus for a work, according to one embodiment of this disclosure.
Figure 2:
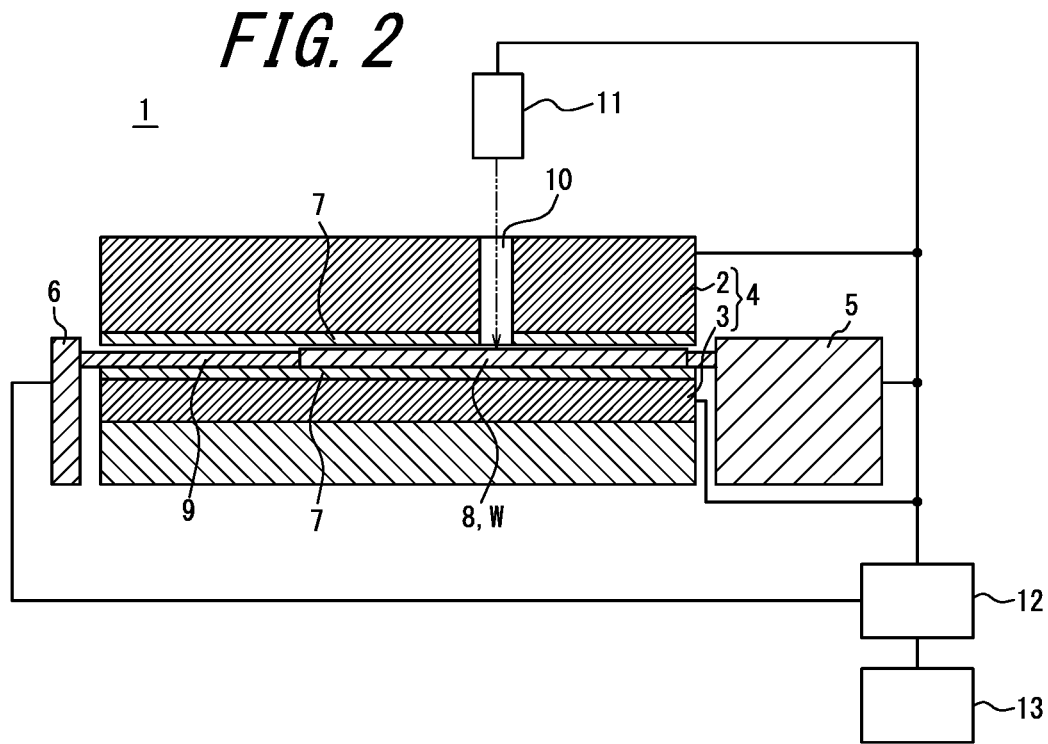
FIG. 2 is a cross-sectional view of FIG. 1 taken along line A-A.

Embodiments of a double-side polishing apparatus for a work according to this disclosure will be described in detail with reference to the drawings. FIG. 1 is a top view of a double-side polishing apparatus for a work according to one embodiment of this disclosure, and FIG. 2 is a cross-sectional view taken along line A-A in FIG. 1. As illustrated in FIGS. 1 and 2, a double-side polishing apparatus 1 includes rotating plates 4 having an upper plate 2 and an opposite lower plate 3; a sun gear 5 provided at the center of rotation of the rotating plates 4, and an internal gear 6 provided in a ring shape around the rotating plates 4. As depicted in FIG. 2, surfaces of the upper and lower rotating plates 4 that face each other, namely, the bottom surface of the upper plate 2 that is a polishing surface and the upper surface of the lower plate 3 that is a polishing surface are each provided with a polishing pad 7 attached thereto.

Further, as illustrated in FIG. 1 and FIG. 2, the apparatus 1 has a plurality of carrier plates 9 having one or more (one in the illustration) wafer retainer openings 8 for holding works. The carrier plates 9 are provided between the upper plate 2 and the lower plate 3. FIG. 1 depicts only one of the plurality of carrier plates 9. The number of the wafer retainer openings 8 may be one or more, for example, may be three. In the illustration, a work (a wafer in this embodiment) W is held in the wafer retainer opening 8.

The apparatus 1 is a planetary gearing double-side polishing apparatus which can rotate the sun gear 5 and the internal gear 6 to cause planetary motion involving the orbital motion and the rotational motion of the carrier plates 9. In other words, while supplying a polishing slurry, the carrier plates 9 are made to perform planetary motion and at the same time, the upper plate 2 and the lower plate 3 are relatively rotated with respect to the carrier plates 9, thereby making the polishing pads 7 attached to the upper and lower rotating plates 4 rubbed against the respective surfaces of the wafers W held in the wafer retainer openings 8 of the carrier plates 9; thus, both surfaces of the wafers W can be polished simultaneously.

Further, as illustrated in FIG. 1 and FIG. 2, in the apparatus 1 of this embodiment, the upper plate 2 is provided with one or more holes 10 for measuring the thickness of each wafer W that penetrate from the top surface of the upper plate 2 to the bottom surface thereof, which is a polishing surface. In the illustration, one hole 10 is placed at a position passing over the wafer W around the wafer's center. In this example, the hole 10 is provided in the upper plate 2. Alternatively, the hole may be provided in the lower plate 3, and one or more holes 10 may be provided in either the upper plate 2 or the lower plate 3. Further, in the illustrations of FIG. 1 and FIG. 2, one hole 10 is provided; alternatively, a plurality of holes may be provided in an orbit on the upper plate 2 (on the dot-dashed line in FIG. 1). Here, as illustrated in FIG. 2, the polishing pad 7 attached to the upper plate 2 is also penetrated by the hole, so that the hole 10 penetrates from the top surface of the upper plate 2 to the bottom surface of the polishing pad 7.

Moreover, as depicted in FIG. 2, the apparatus 1 includes, above the upper plate 2 in the illustration, one or more (one in the illustration) work thickness measuring devices 11 which can measure the thicknesses of the wafers W through the one or more (one in the illustration) holes 10 in real time during double-side polishing of the wafers W. In this example, the work thickness measuring devices 11 are wavelength tunable infrared laser devices. For example, the work thickness measuring devices 11 may include an optical unit for irradiating the wafers W with a laser beam, a detection unit for detecting the laser beam reflected from the wafer W, and an calculating unit for calculating the thickness of the wafer W from the detected laser beam. Such work thickness measuring devices 11 make it possible to calculate the thickness of the wafers W from the difference between the optical path lengths of a reflection component of the laser beam incident on the wafer W, reflected at the front surface of the wafer and a reflection component thereof reflected at the rear surface of the wafer W. Note that the work thickness measuring devices 11 may be of any type as long as the thickness of works can be measured in real time; accordingly, they are not limited in particular to the type using infrared laser as described above.

Further, as depicted in FIG. 2, the double-side polishing apparatus 1 of this embodiment includes a control unit 12. As illustrated in FIG. 2, in this example, the control unit 12 is connected to the upper and lower plates 2 and 3, the sun gear 5, the internal gear 6, and the work thickness measuring devices 11.

The double-side polishing apparatus 1 includes a computing unit 13 for determining, during double-side polishing of works, timing of termination of the double-side polishing of the works, which computing unit is connected to the control unit 12. The computing unit 13 acquires data of the thicknesses of the works measured using the thickness measuring devices 11 and determines timing of termination of double-side polishing of the works. A process performed by the computing unit 13 is described below taking an example of the case when the work thickness measuring devices 11 are infrared lasers, the number of the holes 10 provided in the upper plate 2 is 5, the number of the carrier plates 9 is 5, and one wafer W is heled as a work by each carrier plate 9.

The thicknesses of the wafers W measured by the work thickness measuring devices 11 are accurately measured when the surfaces of the wafers W are irradiated with laser light emitted from the work thickness measuring devices 11 through the holes 10 in the upper plate 2.

On the other hand, when laser light does not pass through the holes 10 and illuminates the surface of the upper plate 2; or when laser light passes through the holes 10, but illuminates the surface of the carrier plates 9 instead of the surface of the wafers W, the thicknesses of the wafers W are not acquired. Hereinafter, a continuous time interval during which the thicknesses of the wafers W are measured using the work thickness measuring devices 11 is referred to as a "measurable interval", and each interval during which the thicknesses of the wafers W are not measured accurately is referred to as an "immeasurable interval".

In some cases, the shapes of the wafers W cannot be accurately evaluated even when using data obtained with respect to the measurable intervals if the data greatly vary. In such a case, the shapes of the wafers W can be evaluated by averaging the data corresponding to each hole 10, obtained with respect to the measurable interval.

Specifically, as described above, the upper plate 2 has five holes 10 for measuring thickness. Accordingly, when the upper plate 2 is rotated at for example 20 rpm (3 s cycle), laser light from the work thickness measuring devices 11 passes through the holes 10 at intervals of 0.6 s. Further, when the time required for the passage through the diameter of the holes 10 (for example, 15 mm) is 0.01 s, the time interval between a measurable interval of a certain hole 10 and the next measurable interval, that is, an immeasurable interval is 0.01 s or more and 0.59 s or less. Accordingly, when the immeasurable interval is 0.01 s or more and 0.59 s or less as mentioned above, consecutive data measured up to the immeasurable interval are regarded as data obtained by consecutive measurements on one of the holes 10 and are averaged, and the measurement is determined to proceed to the next hole 10. Further, an immeasurable interval may be observed even when a hole 10 passes right below the work thickness measuring devices 11 if no wafer W is present under the hole. Therefore, when the measurement proceeds from one of the holes 10 currently subjected to the measurement to the second one over the hole 10, the time interval between the current measurable interval and the next measurable interval, that is, the immeasurable interval is 0.59 s or more and 1.19 s or less.

Further, even data averaged as described above may include outliers observed for example when the thickness of the outermost peripheral portion of a wafer is measured. In some cases where the data include outliers as described above, the shape of the wafer W cannot be accurately evaluated. Accordingly, outliers are preferably removed first from the measured thickness data.

Figure 3:
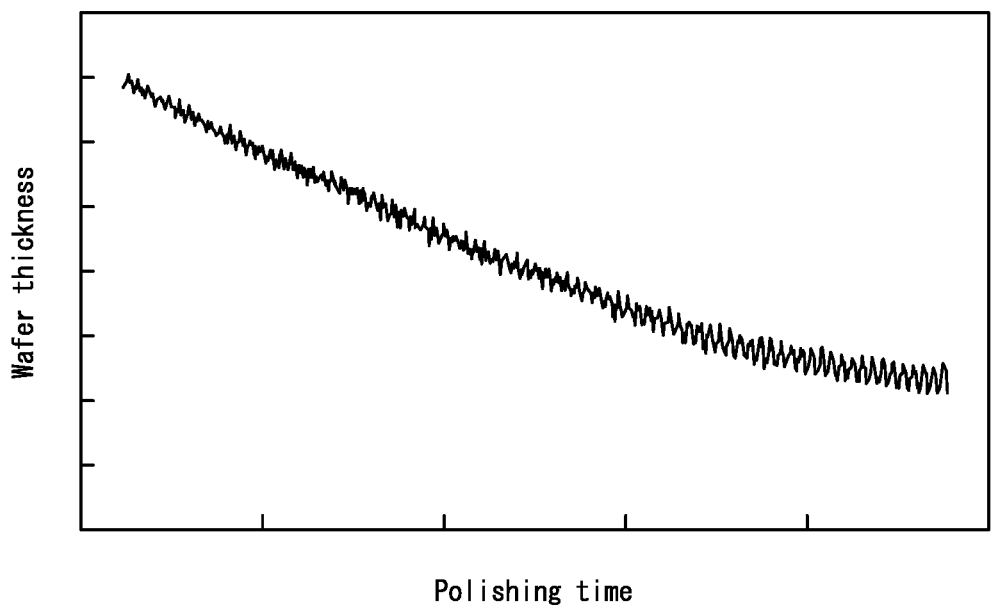
FIG. 3 is a diagram illustrating example thickness data of wafers, from which outliers have been removed.

The removal of the outliers can be performed based on the initial thickness of the carrier plates 9, the initial thickness of the wafers W, etc. Further, with a certain number of measurement values of the wafer thickness obtained, statistically, for example, the data of the measured values of which standard deviation exceeds a predetermined value (for example, 0.2 μm) may be removed as outliers. Hereinafter, the values left after removing the outliers are referred to as "normal values". FIG. 3 illustrates example thickness data of the wafers W, from which outliers have been removed.

When the wafers W are double-side polished under typical polishing conditions, measurable intervals and immeasurable intervals for the thickness of the wafers W alternately occur; for example, a measurable interval occurs and an immeasurable interval then occurs, followed by the occurrence of another measurable interval. Here, the occurrence of an immeasurable interval means that the wafer W irradiated with laser light is changed. Thus, the data of the thicknesses measured in measurable intervals can be grouped for each wafer using such an occurrence of an immeasurable interval as an indication (first step).

Studies made by the inventors of this disclosure revealed that when the thickness of one wafer W held in one carrier plate 9 is measured in a measurable interval, and an immeasurable interval occurs after that; the wafer W of which thickness is measured in the next measurable interval is not always a wafer held in an adjacent carrier plate 9, but may be a wafer held in a carrier plate 9 which is two or more carrier plates away from the original carrier plate 9.

Specifically, when carrier plates 9 labeled A, B, C, D, and E arranged in a circle revolve so that the carrier plates move toward the work thickness measuring devices 11 in the order of A, B, C, D, E, A, B, . . . ; in a case where the thickness of the wafer W held in the carrier plate 9 labeled A is measured and an immeasurable interval occurs, a wafer to be subjected to a measurement in the following measurable interval may be the wafer W held in the carrier plate 9 labeled C two carrier plates away from the carrier plate 9 labeled A. In this case, the time period of the immeasurable interval is longer than in the case where the wafer W in the adjacent carrier plate 9 labeled B is subjected to the measurement.

Accordingly for example, whether the thickness of the wafer W in the carrier plate 9 labeled B was measured or the thickness of the wafer W of the carrier plate 9 labeled C or D was measured after the wafer W in the carrier plate 9 labeled A can be determined based on the time period of the immeasurable interval, that is, the time interval between the measurable interval and the next measurable interval. Thus, the thickness data of the wafers W can be correctly grouped on a wafer W basis.

Figure 4:
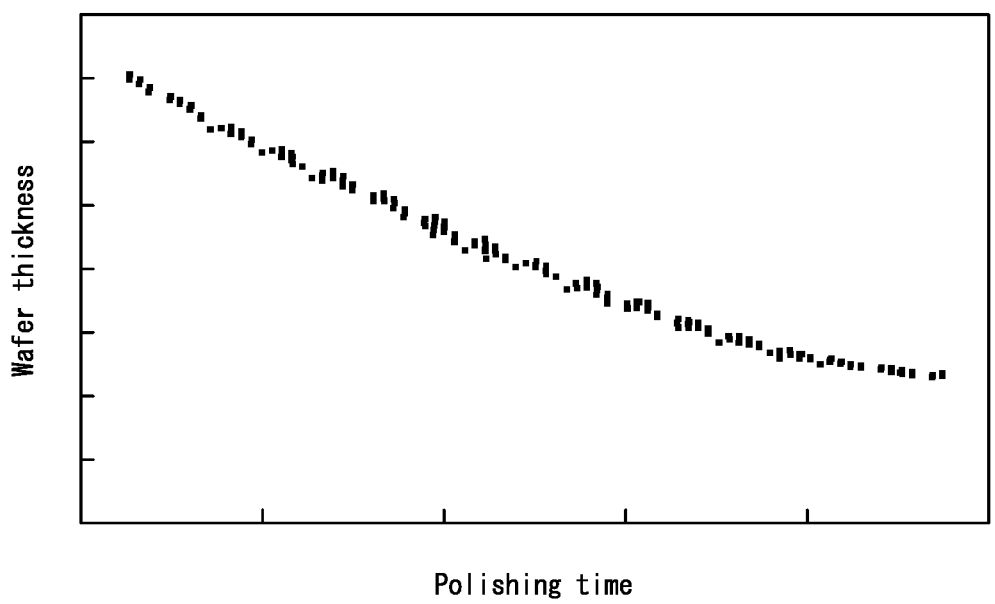
FIG. 4 is a diagram illustrating the thickness data of one wafer W, separated from the thickness data given in FIG. 3.

FIG. 4 illustrates the thickness data of one wafer W, separated from the thickness data given in FIG. 3. Although not shown, also for the other four wafers W, the thickness data of the wafers W exhibiting similar tendencies illustrated in FIG. 4 are obtained.

Next, the thickness data of the wafers W grouped on a wafer W basis are subjected to the following steps. First, the shape components of the wafers W are extracted from the thickness data of the wafers W (second step). The thicknesses of each wafer W grouped in the first step are reduced as the polishing time is increased. Namely, since the average thickness of the wafer W is reduced as the polishing time is increased, the thickness data obtained in the first step not only include changes in the shape components of the surface of the wafer W with time but also changes in the average thickness of the wafer W with time. Accordingly, the changes in the shape components of the surface of the wafer W with time are extracted by removing the changes in the average thickness of the wafer with time from the thickness data of the wafer W.

Figure 5:
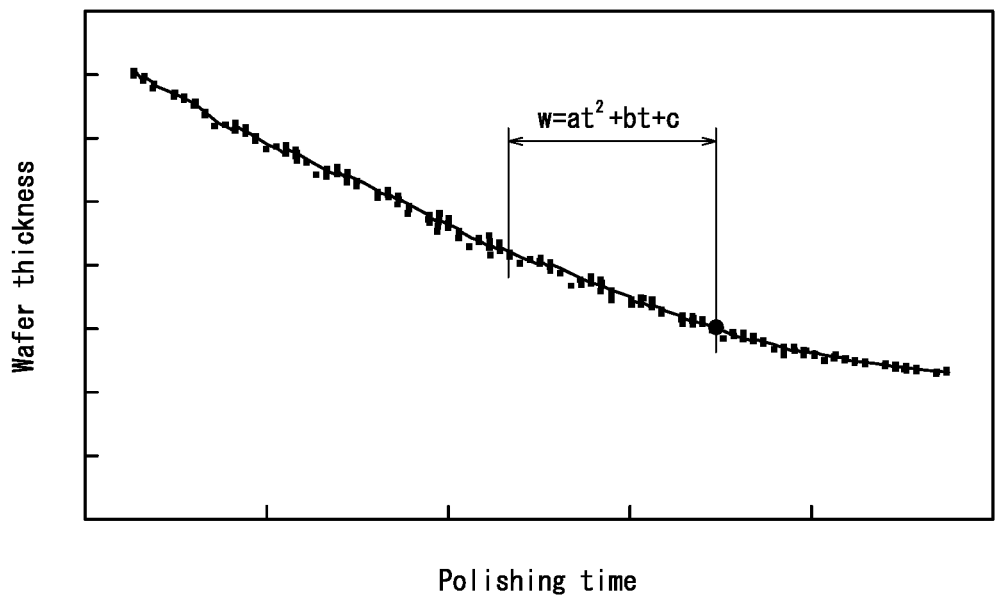
FIG. 5 is a diagram illustrating change in the average thickness of the wafer with time, which average thickness has been obtained by approximating the thickness data of the wafer given in FIG. 4 by a quadratic function.

The changes in the average thickness of the wafer W can be approximated by a quadratic function. FIG. 5 illustrates change in the average thickness of the wafer W with time, which average thickness has been obtained by approximating the thickness data of the wafer W given in FIG. 4 by a quadratic function. As illustrated in the diagram, the thickness data of the wafer W can be well fitted with a quadratic function. Thus, changes in the average thickness of the wafer W with time can be obtained. Next, the changes in the average thickness of the wafer W obtained as described above are subtracted from the thickness data of the wafer W. Thus, the changes in the shape components of the surface of the wafer W with time can be extracted. The obtained changes in the shape components with time are given in FIG. 6.

Figure 7:
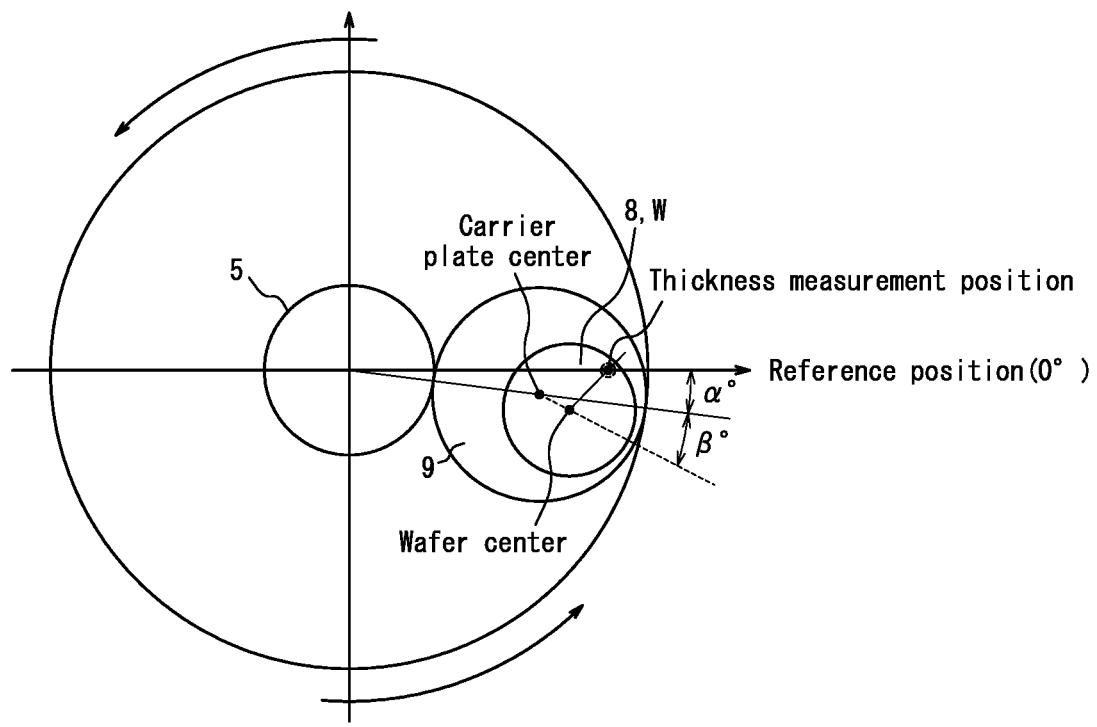
FIG. 7 is a diagram illustrating an example of the positional relationship between a carrier plate and a wafer at a time point when the thickness of the wafer is measured.

Subsequently, for each shape component of the wafer W extracted as described above, the position in the wafer radial direction of the wafer W subjected to the measurement, that is, the distance of the position from the wafer center is determined (third step). FIG. 7 illustrates an example of the positional relationship between the carrier plate 9 and the wafer W at a time point when the thickness of the wafer W is measured. In this diagram, the thickness measurement position (that is, the position of the wafer thickness measuring device 11 or the position of the center of the hole 10) lies on the reference line, and the distance from the center of the sun gear 5 to the thickness measurement position (namely, the distance from the center of the sun gear 5 to the center of the hole 10) is a design value and is known. Similarly, the radii of the rotating plates 4, sun gear 5, and the carrier plate 9; and the distance from the center of the carrier plate 9 to the center of the wafer W are also design values and are known.

Further, α is the revolution angle of the carrier plate 9, which is an angle between the reference position (reference line) and the line joining the center of the sun gear 5 and the center of the carrier plate 9. Further, β indicates the rotation angle of the carrier plate 9, which is an angle between the line joining the center of the sun gear 5 and the center of the carrier plate 9 and the line joining the center of the carrier plate 9 and the center of the wafer W.

Not only in the double-side polishing apparatus 1 of this disclosure, but in typical double-side polishing apparatuses, the angle from the reference position (reference line) (or the displacement) is monitored and controlled using a device called "encoder" in order to check whether the rotating plates 4 and the carrier plates 9, etc. are rotated under predetermined conditions. Accordingly, the revolution angle α and the rotation angle β at the time point of measurement of the thickness of the wafer W can be determined. Further, the center position of the carrier plate 9 can be determined from the determined revolution angle α, and the center position of the wafer W can be determined from the rotation angle β. As described above, since the distance from the center of the sun gear 5 to the thickness measurement position (i.e., the center of the hole 10) is known, the distance from the center of the wafer W to the thickness measurement position, that is, the position of each shape component of the wafer W in the wafer radial direction can be found.

Thus, the position of each shape component of the wafer W in the wafer radial direction can be determined from the radii of the rotating plates 4, the sun gear 5, and the carrier plate 9 that are design values; the distance from the center of the carrier plate 9 to the center of the wafer W; the position of the wafer thickness measuring device 11 (namely, the distance from the center of the sun gear 5 to the center of the hole 10); and (1) the revolution angle α of the carrier plate 9 and (2) the rotation angle β of the carrier plate 9 at the time of measurement of the thickness of the wafer W.

As described above, (1) the revolution angle α of the carrier plate and (2) the rotation angle β of the carrier plate 9 can be found by actual measurement. However, high accuracy is required for the actual measurement of those values. Accordingly, it is preferred that the position of each shape component of the wafer W in the wafer radial direction is preferably found by determining (1) and (2) by simulation from the pattern of measurable intervals in a certain time period (for example, 200 s) from the start of polishing.

Specifically, the time pattern (that is, the pattern of the measurable intervals) in which the thickness of the wafer W is measured and the relevant position subjected to the thickness measurement (that is, the position of the shape component of the wafer W in the wafer radial direction) are found by simulation by setting polishing conditions of: the rotation speed (rpm) of the upper plate 2, the revolution number (rpm) of the carrier plate 9 and the rotation number (rpm) of the carrier plate 9; and the initial position of the wafer W (the revolution angle α and the rotation angle β of the wafer W from the reference position (reference line) in FIG. 7) as parameters.

Further, the rotation speed (rpm) of the upper plate 2, the revolution number (rpm) of the carrier plate 9, and the rotation number (rpm) of the carrier plate 9 at which the pattern of the measurable intervals found by simulation best matches with the pattern of the measurable intervals obtained by actual measurement are found to identify the positions where the thickness is measured. Thus, the position of each shape component of the wafer W in the wafer radial direction can be determined by simulation.

Next, from the identified positions on the wafer W in the wafer radial direction and the shape components of the wafer W, the shape distribution of the wafer W is computed (fourth step). This can be computed using the shape components corresponding to different measurement positions. In this disclosure, the shape distribution of the wafer W after a polishing time t is found using the shape component obtained from the thickness data obtained from the polishing time t−Δt to the polishing time t.

Figure 6:
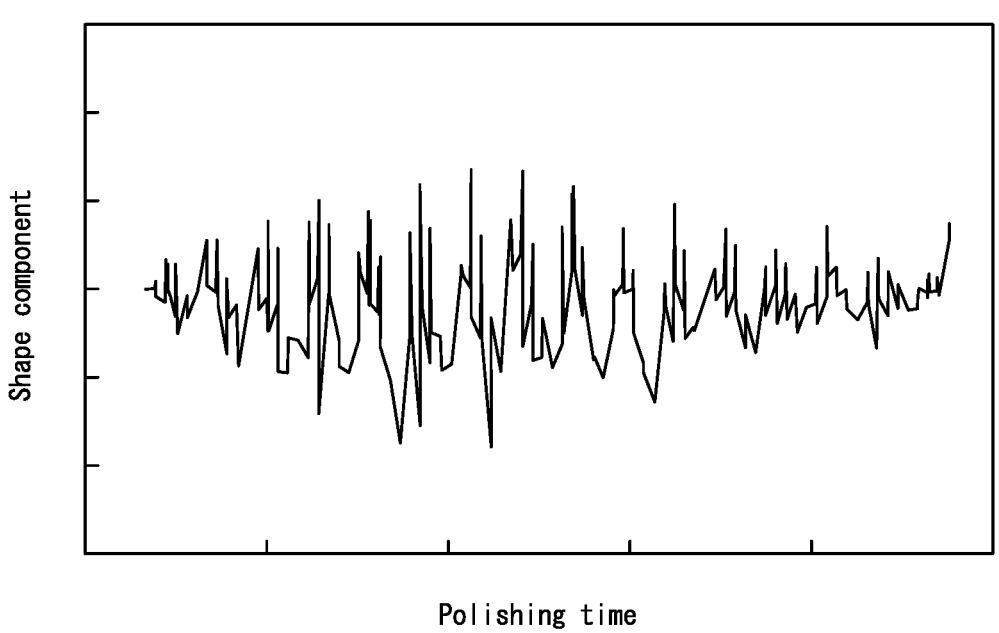
FIG. 6 is a diagram illustrating changes in the shape component of the surface of the wafer with time, which shape component has been extracted from the thickness data of the wafer given in FIG. 4.
Figure 8A:
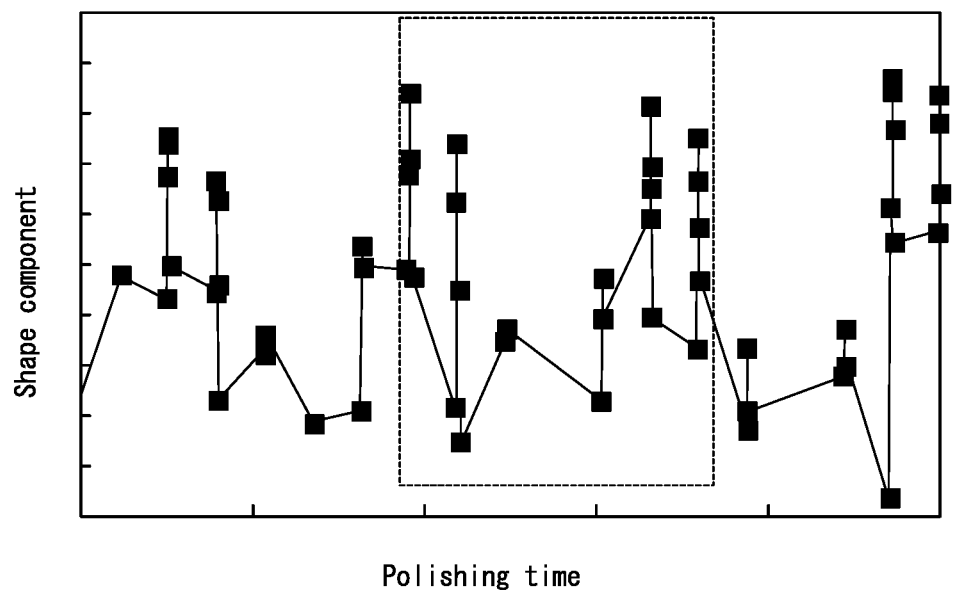
FIG. 8A is an enlarged view of a part of the change in the shape distribution illustrated in FIG. 6, corresponding to the polishing time from 500 s to 1000 s.

FIG. 8A presents an enlarged view of a part of the change in the shape distribution illustrated in FIG. 6, corresponding to the polishing time from 500 s to 1000 s. For example, the shape distribution of the wafer W at a polishing time of 880 s is determined using the shape components corresponding to from 680 s to 880 s in the illustration. The obtained shape distribution is given in FIG. 8B. As is clear from the above description, the obtained shape distribution of the wafer W is not the shape distribution after the polishing time t but exhibits the average shape distribution of the wafer W from the polishing time t−Δt to t.

The time range for the shape components used to determine the above shape distribution depends on the number of measurable data per unit time and depends on the polishing conditions, and so cannot be determined unconditionally. The longer the time range is, the more accurate the shape distribution can be, which on the other hand requires more time for the computation of the shape distribution and limits the rate of computation. By contrast, the shorter the time range is, the shorter the time required to compute the shape distribution, which is advantageous in terms of the rate of computation, yet limits the accuracy of the shape distribution. The inventors found that the shape distribution of the wafer W can be determined with sufficient accuracy by determining the shape distribution using the shape components of a time range of for example 75 s or more. In terms of determining the shape distribution at a high rate with high accuracy, it is more preferred that the shape distribution of the wafer W is determined using the shape components of a time range of 200 s or more and 300 s or less.

Next, the shape index of the wafer W is determined from the shape distribution of the wafer W computed as described above (fifth step). One of the indices representing the flatness of the wafer W is the global backside ideal range (GBIR). A GBIR is an exemplary index representing the global thickness of the whole wafer and is used to evaluate nonuniformity in the thickness of the entire wafer surface. The GBIR can be found as the difference between the maximum value and the minimum value of the shape distribution of the wafer W.

In this disclosure, the GBIR is used as a shape index of the wafer W. However, the obtained GBIR is also the average GBIR of the shape components for a time range from t−Δt to t, used for the computation of the shape distribution, so is not a GBIR in a strict sense. For this reason, the difference between the maximum value and the minimum value of the shape distribution is herein expressed as "shape index of wafer W".

Figure 8B:
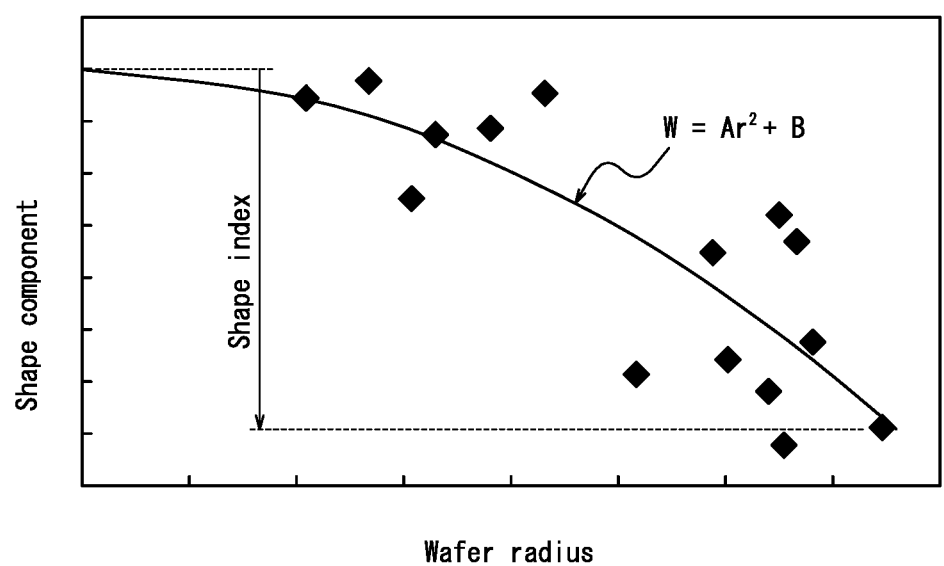
FIG. 8B is a shape distribution obtained from FIG. 8A.

It should be noted that as in the example illustrated in FIG. 8B, when the number of shape components is not sufficient, the shape distribution is approximated by an even function; the maximum value and the minimum value are found from the shape distribution of the wafer W expressed by the obtained even function; and the shape index of the wafer W can be calculated from the determined maximum value and the minimum value.

When the shape components of around the center of the wafer W are obtained, a biquadratic function is preferably used as the even function, since the shape distribution of the wafer W can be well reproduced. On the other hand, when the shape distribution of around the center of the wafer W is not obtained, a quadratic function is preferably used, since the shape distribution of the wafer W can be well reproduced.

Thus, after determining the shape index of each wafer W, the timing of termination of double-side polishing of the wafer is determined based on the determined shape index of each wafer W (sixth step). Specifically, the average of the shape indices of the wafers is calculated, and the timing of termination of double-side polishing of the wafers W is determined based on the average.

Figure 9:
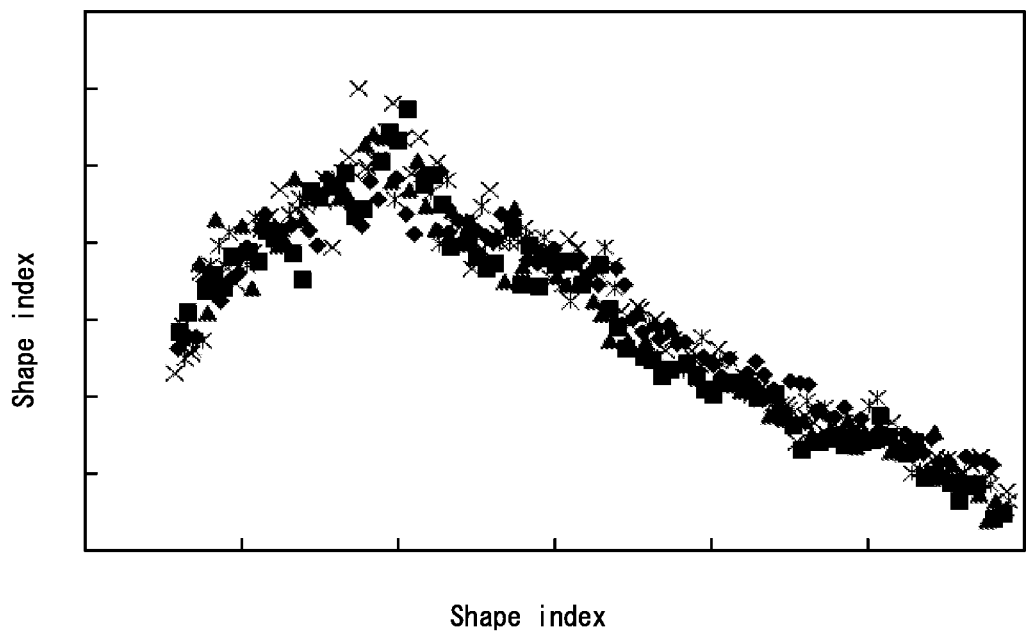
FIG. 9 is a diagram illustrating the relationship between the average of the shape indices of wafers and the polishing time.

FIG. 9 illustrates the relationship between the average of the shape indices of the wafers W and the polishing time. In practice, double-side polishing is terminated with timing when the shape index of the wafers W becomes a predetermined value, for example, zero.

Figure 10:
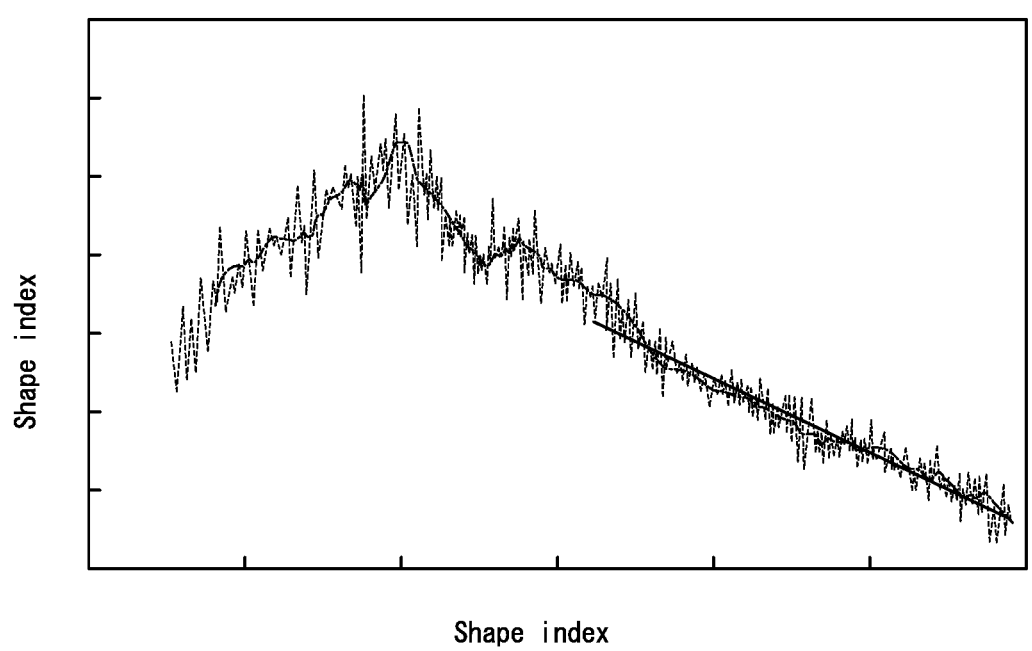
FIG. 10 is a diagram illustrating the shape indices of the wafers, having been linearly approximated.

Typically the surface of each wafer W subjected to double-side polishing is relatively flat before polishing, and after double-side polishing starts, the surface shape of the wafer changes and the flatness is degraded once, so the GBIR increases. However, as the double-side polishing proceeds, the flatness improves, and the GBIR starts to decrease. As the double-side polishing proceeds, the GBIR exhibits a tendency to linearly decrease with the polishing time. The shape indices of the wafers W of this disclosure linearly decrease after the values start to decrease and exhibit a similar tendency to the GBIR. Accordingly, after the shape indices of the wafers W start to decrease, as illustrated in FIG. 10, the time when the shape indices of the wafers W become a predetermined value (for example, zero) can be predicted by linearly approximating a suitable range of the shape indices. According to the studies made by the inventors, the timing of termination of the double-side polishing is determined based on the shape indices of wafers W that are being double-side polished, thus the double-side polishing can be terminated with timing allowing the wafers W having been polished to have a target shape.

(Method of Double-Side Polishing Work)

Next, a double-side polishing method for a work, according to one embodiment of this disclosure will be described. In the method of this embodiment, double-side polishing of the wafers W can be performed using for example, the apparatus depicted in FIG. 1 and FIG. 2. Since the structure of the apparatus depicted in FIG. 1 and FIG. 2 has already been described, the description will not be repeated.

FIG. 11 presents a flowchart of a double-side polishing method for a work, according to this disclosure. Since the method of this disclosure is the same as the method in which the computing unit 13 in the double-side polishing apparatus for a work according to this disclosure as described above determines the time when double-side polishing is terminated; thus, the method will be described briefly, and the detailed description will not be repeated.

First, before the determination of the timing, outliers are removed from the thickness data of the works subjected to measurements using the work thickness measuring devices 11, thereby obtaining the thickness data of the works that are constituted by only normal values. In step S1, the thickness data of the works thus obtained by removing outliers are separated on a work basis (first step). This can be performed for example based on the time intervals in which the thickness data of works are consecutively obtained.

Next, in step S2, for each work, the shape components of the work are extracted from the thickness data of the work (second step). This can be performed for example by approximating the thickness data of the works by a quadratic function and subtracting the changes in the average thickness of the works with time, obtained by the approximation by the quadratic function from the changes in the shape components of the works with time.

Subsequently, in step S3, for each extracted shape component of the works, the position on the work subjected to the measurement in the work radial direction is identified (third step). This allows for the identification of the position of each shape component on the wafer subjected to the measurement in the wafer radial direction by actually measuring the distance between the center of the sun gear 5 and the center of the hole 10, the rotation angle β of the carrier plate 9, and the revolution angle α of the carrier plate 9; or the identification of the position of each shape component of the wafer subjected to the measurement in the wafer radial direction by calculating measurable intervals in which the thickness of the work can be measured by simulation with respect to various conditions of the rotation speed of the upper plate 2, the revolution number of the carrier plate 9, and the rotation number of the carrier plate 9 and determining the rotation speed of the upper plate 2, the revolution number of the carrier plate 9, and the rotation number of the carrier plate 9 at which the calculated measurable intervals and actually measurable intervals best match, as described above.

Next, in step S4, the shape distribution of the work is computed from the identified position of the work in the work radial direction and the shape components of the work (fourth step). In the case where the number of the shape components is small when the shape distribution is determined, approximation may be performed by an even function to obtain the shape distribution.

Subsequently, in step S5, the shape index of the work is obtained from the computed shape distribution of the work (fifth step). In this disclosure, the difference between the maximum value and the minimum value of the shape distribution of the work is used as the shape index of the work.

Next, in step S6, the timing of termination of double-side polishing of the works is determined based on the obtained shape index of each work (sixth step). In this step, the relationship between the shape indices of the works and the polishing time is linearly approximated, and a polishing time after which the shape indices of the works become a predetermined value (for example, zero) can be determined as the timing of termination of the double-side polishing of the works, from the straight line found by the approximation.

Finally, in step S7, the double-side polishing is terminated with the determined timing of termination of the double-side polishing of the works. Thus, the double-side polishing can be terminated with timing allowing the works having been polished to have a target shape.

INDUSTRIAL APPLICABILITY

The method and apparatus for double-side polishing of a work, according to this disclosure are useful in the semiconductor wafer manufacturing industry, since the timing of termination of double-side polishing is determined based on the shape index of a work, and the double-side polishing can be terminated during the double-side polishing with timing allowing the work having been polished to have a target shape.

REFERENCE SIGNS LIST

1: Double-side polishing apparatus
2: Upper plate
3: Lower plate
4: Rotating plate
5: Sun gear
6: Internal gear
7: Polishing pad
8: Wafer retainer opening
9: Carrier plate
10: Hole for measuring wafer thickness
11: Work thickness measuring device
12: Control unit
13: Computing unit
W: Wafer

The invention claimed is:

1. A double-side polishing apparatus for a work, including rotating plates having an upper plate and a lower plate, a sun gear provided at a center portion of the rotating plates, an internal gear provided at a peripheral portion of the rotating plates, and a carrier plate, which is provided between the upper plate and the lower plate provided with one or more openings for holding the work, wherein one of the upper plate and the lower plate has one or more holes penetrating from a top surface to a bottom surface of the one of the upper plate and the lower plate, the double-side polishing apparatus for the work comprises one or more work thickness measuring devices which can measure a thickness of each work through the one or more holes in real time during double-side polishing of the work, and the double-side polishing apparatus comprises a computer for determining, during the double-side polishing of the work, timing of termination of the double-side polishing of the work, wherein the computer is configured to:

group data of thicknesses of the works, measured using the work thickness measuring devices on a work basis;

extract shape components of each work from the thickness data of the work;

identify a position of each of the shape components on the work having been subjected to measurement in a work radial direction;

compute a shape distribution of the work from the identified position on the work in the work radial direction and the shape components of the work;

obtain a shape index of the work from the computed shape distribution of the work; and determine timing of termination of the double-side polishing of the work based on the obtained shape index of the work, wherein the double-side polishing apparatus is configured to terminate the double-side polishing with the determined timing of termination of the double-side polishing of the work.

2. The double-side polishing apparatus for a work, according to claim 1, wherein when the computer identifies the position of each of the shape components on the work having been subjected to the measurement in the work radial direction, the position of each shape component of the work subjected to the measurement in the work radial direction is identified by actually measuring a distance between a center of the sun gear and a center of the hole, a rotation angle of the carrier plate, and a revolution angle α of the carrier plate; or the position of each shape component of the work subjected to the measurement in the work radial direction is identified by calculating measurable intervals in which the thickness of the work can be measured by simulation under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable intervals and actually measurable intervals best match.

3. The double-side polishing apparatus for a work, according to claim 1, wherein when the computer determines the timing of termination of the double-side polishing of the work based on the obtained shape index of the work, a relationship between the shape indices of the works and polishing time is linearly approximated, and a polishing time after which the shape indices of the works become a predetermined value is determined as timing of termination of the double-side polishing of the works, from the straight line found by the approximation.

4. The double-side polishing apparatus for a work, according to claim 1, wherein when the computer obtains the shape index of the work from the computed shape distribution of the work, a relationship between the shape components of the work and the position of each shape component of the work in the work radial direction is approximated by an even function, and a shape index of the work is determined based on a maximum value and a minimum value of the even function obtained by the approximation.

5. The double-side polishing apparatus for a work, according to claim 1, wherein when the computer groups the data of thicknesses of the works, measured using the work thickness measuring devices on the work basis, thickness data of the works are grouped on a work basis based on time intervals in which the thickness data of the works are consecutively obtained.

6. The double-side polishing apparatus for a work, according to claim 1, wherein when the computer extracts the shape components of each work from the thickness data of the work, a relationship between thickness data of the work and polishing time is approximated by a quadratic function, and a difference between the thickness data of the work and the quadratic function obtained by the approximation is used as a shape component.

7. A double-side polishing method for a work, wherein a work is held in a carrier plate provided with one or more openings for holding the work; the work is sandwiched between rotating plates composed of an upper plate and a lower plate; rotation and revolution of the carrier plate are controlled by rotation of a sun gear provided at a center portion of the rotating plates and rotation of an internal gear provided at a peripheral portion of the rotating plates; and thus the rotating plates and the carrier plate are relatively rotated to simultaneously polish both surfaces of the work,
one of the upper plate and the lower plate has one or more holes penetrating from a top surface to a bottom surface of the one of the upper plate and the lower plate, and
the double-side polishing method for a work comprises, during double-side polishing of the work:
grouping data of thicknesses measured using work thickness measuring devices on a work basis;
extracting shape components of each work from the thickness data of the work;
identifying a position of each of the shape components on the work having been subjected to measurement in a work radial direction;
computing a shape distribution of the work from the identified position on the work in the work radial direction and the shape components of the work;
obtaining a shape index of the work from the computed shape distribution of the work; and
determining timing of termination of the double-side polishing of the work based on the obtained shape index of the work,
whereby terminating the double-side polishing with the determined timing of termination of the double-side polishing of the work.

8. The double-side polishing method for a work, according to claim 7, wherein when identifying the position of each of the shape components on the work having been subjected to the measurement in the work radial direction, the position of each shape component of the work subjected to the measurement in the work radial direction is identified by actually measuring a distance between a center of the sun gear and a center of the hole, a rotation angle of the carrier plate, and a revolution angle $\alpha$ of the carrier plate; or the position of each shape component of the work subjected to the measurement in the work radial direction is identified by calculating measurable intervals in which the thickness of the work can be measured by simulation under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable intervals and actually measurable intervals best match.

9. The double-side polishing method for a work, according to claim 7, wherein when determining the timing of termination of the double-side polishing of the work based on the obtained shape index of the work, a relationship between the shape indices of the works and polishing time is linearly approximated, and a polishing time after which the shape indices of the works become a predetermined value is determined as timing of termination of the double-side polishing of the works, from the straight line found by the approximation.

10. The double-side polishing method for a work, according to claim 7, wherein when obtaining the shape index of the work from the computed shape distribution of the work, a relationship between the shape components of the work and the position of each shape component of the work in the work radial direction is approximated by an even function, and a shape index of the work is determined based on a maximum value and a minimum value of the even function obtained by the approximation.

11. The double-side polishing method for a work, according to claim 7, wherein when grouping the data of thicknesses measured using the work thickness measuring devices on the work basis, thickness data of the works are grouped on a work basis based on time intervals in which the thickness data of the works are consecutively obtained.

12. The double-side polishing method for a work, according to claim 7, wherein when extracting the shape components of each work from the thickness data of the work, a relationship between thickness data of the work and polishing time is approximated by a quadratic function, and a difference between the thickness data of the work and the quadratic function obtained by the approximation is used as a shape component.

* * * * *